United States Patent
Aigner et al.

(10) Patent No.: US 6,955,950 B2
(45) Date of Patent: Oct. 18, 2005

(54) METHOD FOR GENERATING A PROTECTIVE COVER FOR A DEVICE

(75) Inventors: Robert Aigner, Unterhaching (DE); Martin Franosch, Munich (DE); Andreas Meckes, Munich (DE); Klaus-Günter Oppermann, Holzkirchen (DE); Marc Strasser, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/888,568

(22) Filed: Jul. 9, 2004

(65) Prior Publication Data

US 2005/0048757 A1 Mar. 3, 2005

Related U.S. Application Data (63) Continuation of application No. PCT/EP02/14194, filed on Dec. 12, 2002.

(30) Foreign Application Priority Data

Jan. 11, 2002 (DE) .......................................... 102 00 869

(51) Int. Cl.[7] .............................................. H01L 21/44
(52) U.S. Cl. ....................... 438/125; 438/110; 257/701; 257/704
(58) Field of Search ................................ 257/701, 704; 438/110, 125

(56) References Cited

U.S. PATENT DOCUMENTS

| | | | |
|---|---|---|---|
| 5,548,099 A | 8/1996 | Cole, Jr. et al. | 219/121.69 |
| 5,771,902 A | 6/1998 | Lee et al. | 128/897 |
| 6,030,515 A | 2/2000 | Heyers et al. | 205/118 |
| 6,136,212 A | 10/2000 | Mastrangelo et al. | 216/49 |
| 2001/0004085 A1 * | 6/2001 | Gueissaz | 228/124.6 |
| 2003/0139040 A1 * | 7/2003 | Schoefthaler et al. | 438/689 |
| 2005/0009316 A1 * | 1/2005 | Franosch et al. | 438/613 |

FOREIGN PATENT DOCUMENTS

| | | |
|---|---|---|
| DE | 19732250 A1 | 1/1999 |
| EP | 0 373 360 B1 | 10/1995 |
| JP | 08162899 A | 6/1996 |
| JP | 08181564 A | 7/1996 |
| JP | 09172339 A | 6/1997 |
| WO | WO01/92842 A | 12/2001 |
| WO | WO03057618 A2 * | 7/2003 .............. B81B/3/00 |

OTHER PUBLICATIONS

Elderstig, H et al., "Spin Deposition of Polymers Over Holes and Cavities", Sensors and Actuators A 46–47, Elsevier Science S.A., Lausanne, 1995, pp. 95–97 (3 pages).

* cited by examiner

*Primary Examiner*—Christian Wilson
(74) *Attorney, Agent, or Firm*—Maginot, Moore & Beck (57) ABSTRACT

In a method for generating a protective cover for a device, where a substrate is provided, which comprises the device, first, a sacrificial pattern is generated on the substrate. The sacrificial pattern covers at least an area of the substrate, which comprises the device. Then, a polymer layer is deposited, which comprises at least on sacrificial pattern. Then, an opening will be formed in the polymer layer to expose a portion of the sacrificial pattern. Then, the sacrificial pattern will be removed and the formed opening in the polymer layer is closed.

20 Claims, 7 Drawing Sheets

METHOD FOR GENERATING A PROTECTIVE COVER FOR A DEVICE

CROSS-REFERENCE TO RELATED APPLICATION

This application is a continuation of copending International Application No. PCT/EP02/14194, filed Dec. 12, 2002, which designated the United States and was not published in English.

BACKGROUND OF THE INVENTION

1. Field of the Invention

The present invention relates to a method for generating a protective cover for a device, and particularly for generating a protective cover for devices containing areas whose function would be affected by injection molded packages, such as BAW filters (BAW=bulk acoustic wave), resonators, sensors and/or actuators. Particularly, the present invention relates to a method for generating such a protective cover for the devices on wafer level.

2. Description of the Related Art

Conventionally, devices are generated on and/or in a substrate, wherein after completing the device, the substrate comprising the device is disposed in a protected way in an injection molded package. In this arrangement, the substrate and the device are fully embedded into the material of the injection molded package, at least in the area of the device. This procedure is disadvantageous for devices whose function is affected by this material, which thus require a clearance for a proper functionality, such as it is, for example, required in the above-mentioned BAW filters, resonators, sensors and actuators.

One solution known in the prior art to solve this problem with injection molded packages is to provide a "counter substrate", into which a respective opening is inserted, so that during the assembly of the device substrate and the package substrate, the cavity is disposed in the area of the device in the device substrate, so that no longer any effect on the functionality of the device occurs. On the wafer level, respectively, a wafer is generated with the respective patterns for the devices (system wafer), which is connected, for example by a bond procedure, to a second wafer (lid wafer), which has respective trenches and holes, which are for example made by etching the same. In that way, the trenches of the second wafer will form cavities across the sensitive pattern of the first wafer, whereby the contact pads of the first wafer are accessible through the holes in the second wafer. Thereby, the sensitive patterns are protected.

As an alternative to the above-described procedures, a ceramic package can be used.

The disadvantage of the above-described known solutions for ensuring the functionality of the devices is that there is always a second substrate and a second wafer to be patterned, which requires processing and handling separate from the first wafer. This leads to a very expensive total production and further increases the requirements with regard to the required process accuracy.

SUMMARY OF THE INVENTION

It is the object of the present invention to provide a simplified method for generating a protective cover for devices, which enables the generation of a protective cover in a simple way without requiring a separate processing of further wafers and/or substrates.

The present invention provides a method for generating a protective cover for a device, wherein a wafer is provided, which comprises a plurality of devices, wherein each of the devices has a sensitive device area and a pad area, the method comprising: (a) forming a sacrificial pattern on a surface of the wafer, wherein the sacrificial pattern covers at least areas of the wafer, which comprise the sensitive device area of the devices; (b) depositing a polymer layer, which covers the sacrificial pattern and exposed areas of the surface of the wafer; (c) patterning the polymer layer to expose simultaneously a portion of the sacrificial pattern through an opening in the polymer layer and the pad area; (d) removing the sacrificial pattern; (e) closing the opening formed in the polymer layer; and (f) singulating the wafer.

The present invention is based on the knowledge that the expensive way of generating protective layers for devices known in the prior art can be omitted by incorporating the generation of the protective layer into the "running" production process for the devices. The cavity across a sensitive area of a device is generated by using a sacrificial layer process and a closing process with different polymer materials. The final strength of this "on chip" lid is sufficiently high to use a further processing in standard packaging methods, which means methods where the chips are introduced into packages.

According to a preferred embodiment of the present invention the inventive method is used on wafer level, in order to enable the generation of a protective cover in a simple way according to the inventive method for a plurality of devices formed in the wafer.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

In the following description of the preferred embodiments of the present invention, the same reference numbers are used for the similar elements represented in the different drawings.

Figure 1:
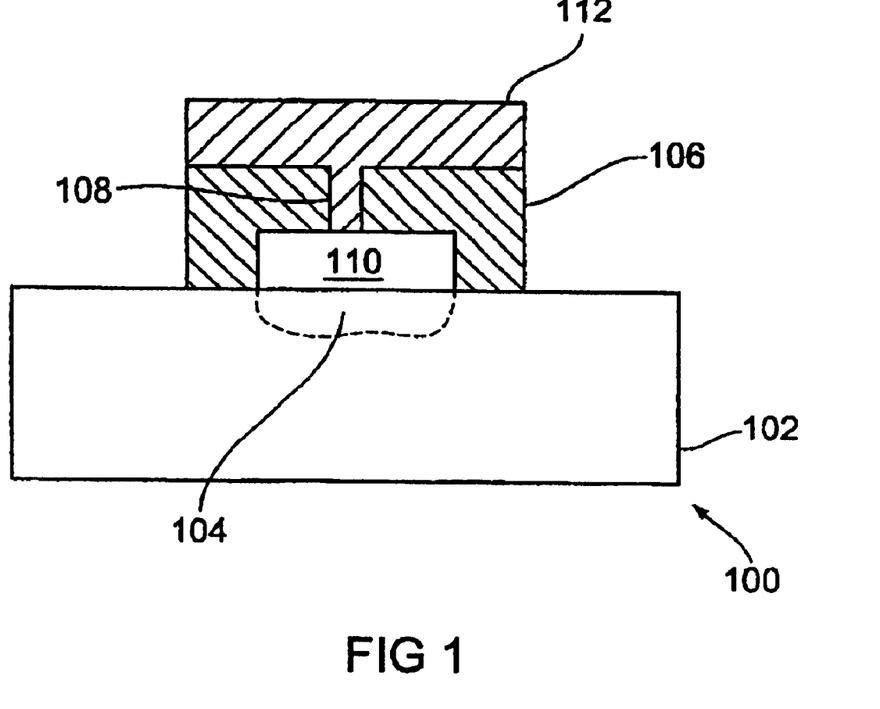
FIG. 1 is the illustration of a device with protective cover, which has been produced according to a first embodiment of the present invention.

With regard to FIG. 1, element 100 is shown, which has been produced according to the embodiment of the present invention.

In the embodiment shown in FIG. 1, a substrate 102 is provided, which comprises a device area 104. In the device area 104 of the substrate 102, the device is formed, for which a protective cover according to the inventive method is to be generated. The device can be a device fully disposed within the substrate 102 or a device, which is partly exposed to a surface of the substrate 102. In connection with the present invention, the term substrate is to mean that it contains already the completely processed devices, and for simplifying the illustration, a device area is indicated merely schematically in the figure, without referring to the more detailed pattern of the individual devices. The mentioned devices are, for example, BAW filters, resonators, sensors and/or actuators.

According to the present invention, first one sacrificial pattern, which is no longer visible in FIG. 1, is deposited on the substrate 102, which has covered at least the sensitive area of the device area 104. According to the invention, subsequently, a polymer layer 106 was generated, which at least encloses the sacrificial pattern. An opening 108 was formed in the polymer layer 106 to expose a portion of the sacrificial pattern. Subsequently, the sacrificial pattern has been removed, so that the cavity 110 shown in FIG. 1 has resulted across the device area 104. Finally, the opening 108 was closed, in the embodiment illustrated in FIG. 1 by depositing a further polymer layer 112 on the first polymer layer 106.

According to the invention, the problems occurring in the prior art are solved by refraining from using a further substrate and a further wafer, respectively. Instead, a sacrificial layer, such as a photo patternable resist, is deposited on the substrate/the wafer 102 and then patterned, so that the sacrificial layer remains merely in the areas which are to be protected later by the protective cover. The sacrificial layer is then coated with the polymer layer 106, so that the sacrificial layer will then be fully covered therewith. Thereby, it should be taken care that a solvent possibly used for patterning the polymer layer does not bite or dissolve the sacrificial layer. Further, the first polymer layer 106 is to be deposited with a thickness, which has a high final strength and hardness. As material for the polymer layer, for example, SU-8 of MicroChem, USA can be taken into consideration. Preferably, the thickness of the deposited first polymer layer 106 is less than 20 $\mu$m. The polymer layer will then be patterned and provided with several holes 108 over the sacrificial layer, so that the sacrificial layer can be dissolved through these holes. In connection with the dissolution of the sacrificial layer, however, it has to be made sure that the solvent used here does neither bite nor fully dissolve the material of the polymer layer.

According to a preferred embodiment of the present invention, then, the resulting patterns, which comprise the thick protective resist (polymer layer), are dried. As long as the resulting cavities 110 are sensitive and tend to stick during the drying process, a drying process in a super critical point drier can also be used (SCPD).

As in the embodiment illustrated in FIG. 1, the resulting protective pattern is coated with the further polymer layer 112, and possibly fully enclosed by the same. The materials of the first polymer layer and the further polymer layer can be the same. The polymer layer should also be deposited as a thick layer, preferably with a thickness of less than 20 $\mu$m. This ensures that the layer sequence is present with sufficiently high hardness and end strength at the end of the process. Finally, according to a further embodiment, a patterning of the further polymer layer (closing layer) takes place to expose contact pads and in the case of wafers, cutting lines.

With regard to the sacrificial layer it should be noted that this could be in the simplest case a photoresist. Alternatively, the sacrificial layer can also be formed of metal, such as copper, titanium, aluminum, or an oxide, such as silicon dioxide ($SiO_2$).

As an alternative to the above-described closing technique of the holes 108 (see FIG. 1) a laminated photo patternable file can be used instead of the further polymer layer 112.

According to a further embodiment, closing the holes can be performed via metal paste, such as screen printing, which is particularly advantageous in combination with flip chip bumps.

Subsequently, a first preferred embodiment of the present invention will be described in more detail with reference to FIG. 2, where a plurality of devices on a wafer are provided with a protective cover. For simplifying the illustration, merely the relevant steps for generating the protective cover are shown in FIG. 2, but not the devices formed in the wafer. For the subsequent description, the term "wafer" is, among others, used with the meaning that all required devices are already completely processed.

Figure 2A:
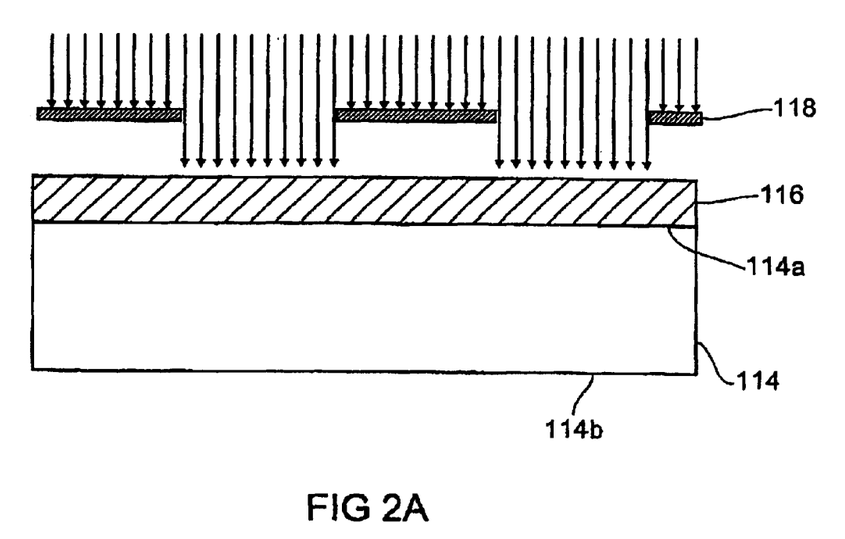
FIGS. 2A–2H are the individual production steps of the inventive method according to a first embodiment.
Figure 2B:
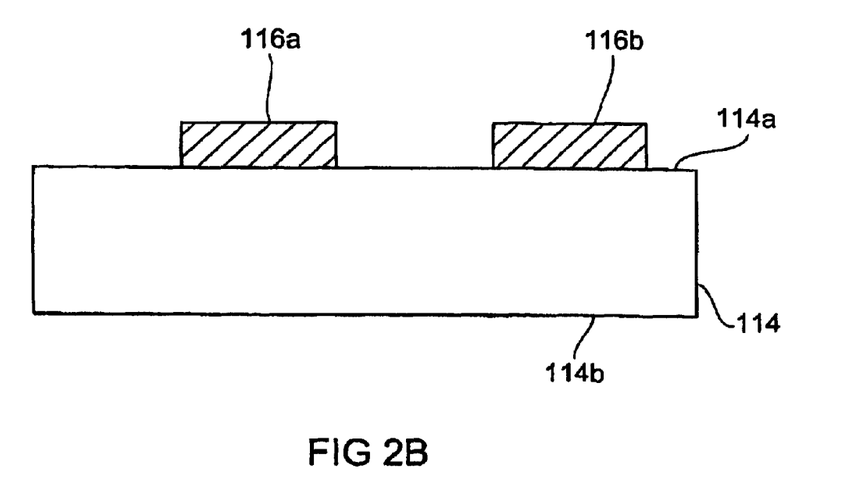
Figure 2C:
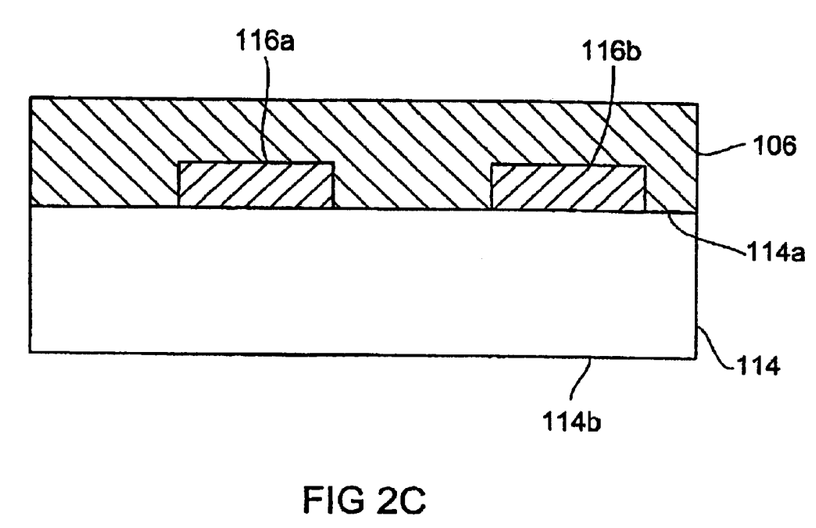
Figure 2D:
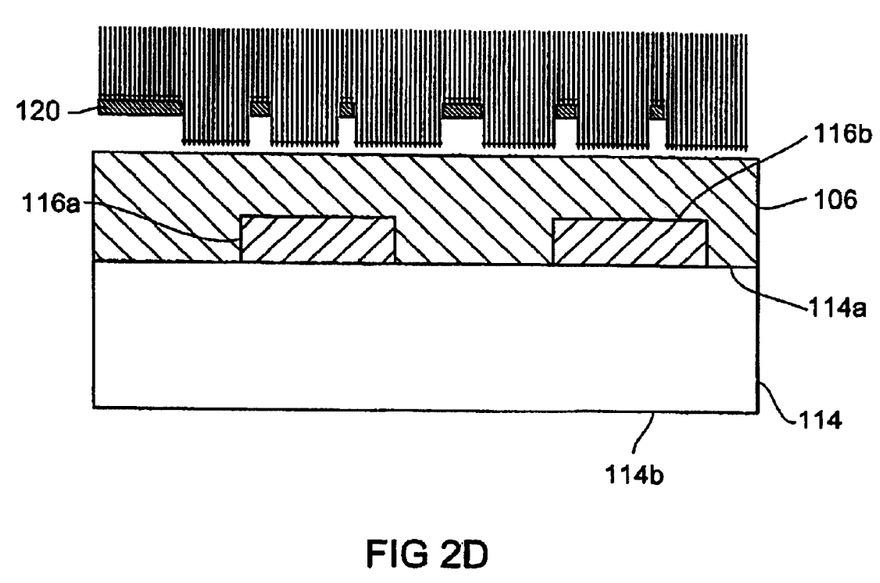
Figure 2E:
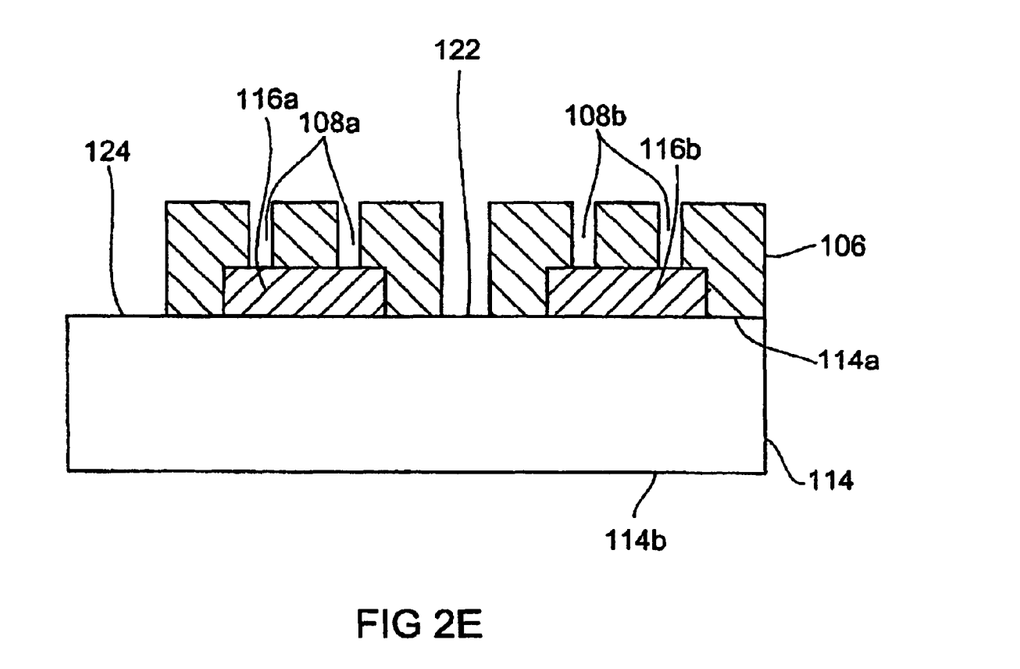

In FIG. 2A the wafer 114 is shown, which has a first surface 114a and a second surface 114b opposing the first surface 114a. A sacrificial layer 116 is formed on the first surface 114a of the wafer 114, for example of a photoresist, a metal or an oxide layer. In a first method step, the sacrificial layer 116 is exposed by using a mask 118, as it is indicated by the arrows shown in FIG. 2A. Through the mask 118, those areas are defined, which subsequently are to remain over the sensitive areas of the wafer 114. Subsequent to the exposure, the sacrificial layer 116 is patterned, for example by developing the sacrificial layer, so that the structure illustrated in FIG. 2B results, consisting of wafer 114 and consisting of two sacrificial patterns 116a and 116b disposed over the sensitive areas of the devices in the wafer. Then the sacrificial layer 116 patterned in that way is coated with a first polymer layer 106, by depositing the same on the first surface 114a as well as the sacrificial patterns 116a and 116b, as it is shown in FIG. 2C. Preferably, the first polymer layer 106 is deposited on the wafer 114 with a thickness of less than 20 $\mu$m.

In a subsequent step (see FIG. 2D), the polymer layer 106 is exposed by using a further mask 120. The mask 120 defines areas where subsequently openings are formed in the first polymer layer 106 to the sacrificial patterns 116a and 116b, and further, additional contact pad areas as well as cutting lines for a later singulation of the wafer into single elements are defined by the mask 120. The exposed areas of the polymer layer 106 defined by the mask 120 are cross-linked by the exposure. The non-cross-linked areas of the polymer layer 106 are removed in a subsequent development step, so that the structure shown in FIG. 2E results. As can be seen, the first polymer layer 106 has been patterned, so that now the openings 108a are formed, which expose part of the sacrificial pattern 116a. In the same way, openings 108b have been generated, which expose part of the sacrificial pattern 116b. Additionally, a cutting line 122 as well as a contact pad area 124 was exposed on the wafer 114. Via the pad area 124, later, contacting the devices generated in the wafer is done.

Figure 2F:
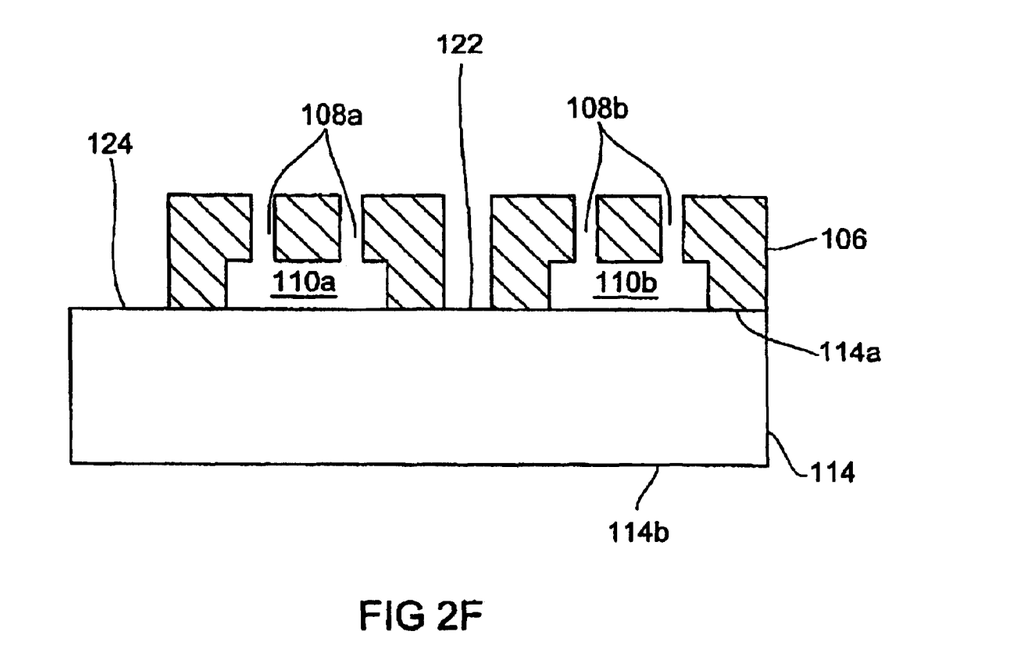

Through the holes 108a and 108b generated in the polymer layer 106, the underlying sacrificial patterns 116a and 116b, respectively, are dissolved out, and in that way the cavities 110a, 110b illustrated in FIG. 2F are generated.

Figure 2G:
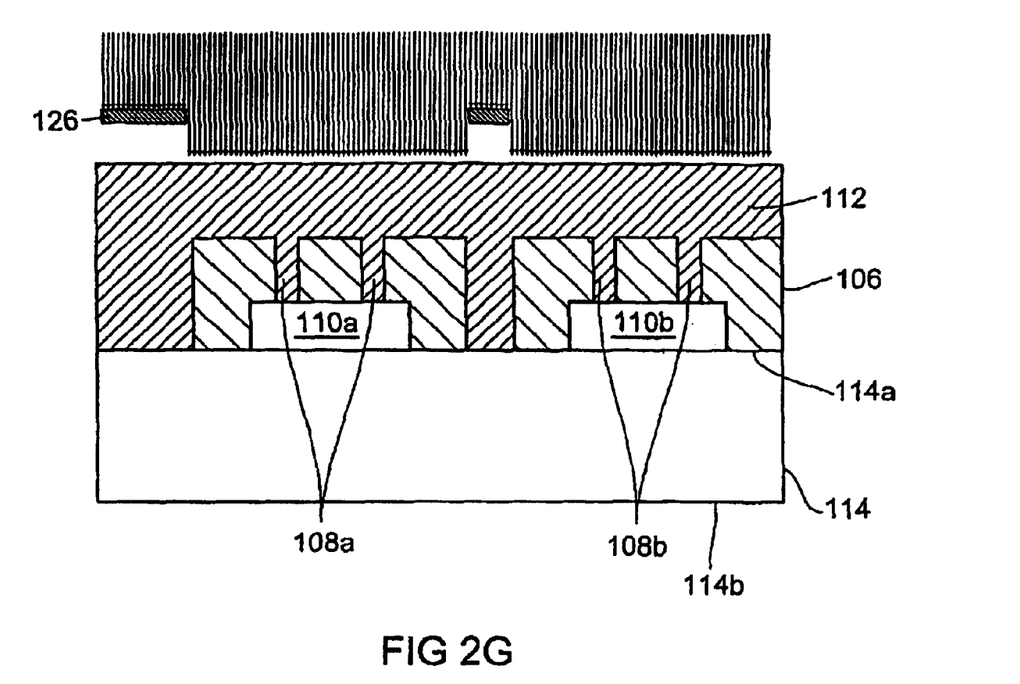
Figure 2H:
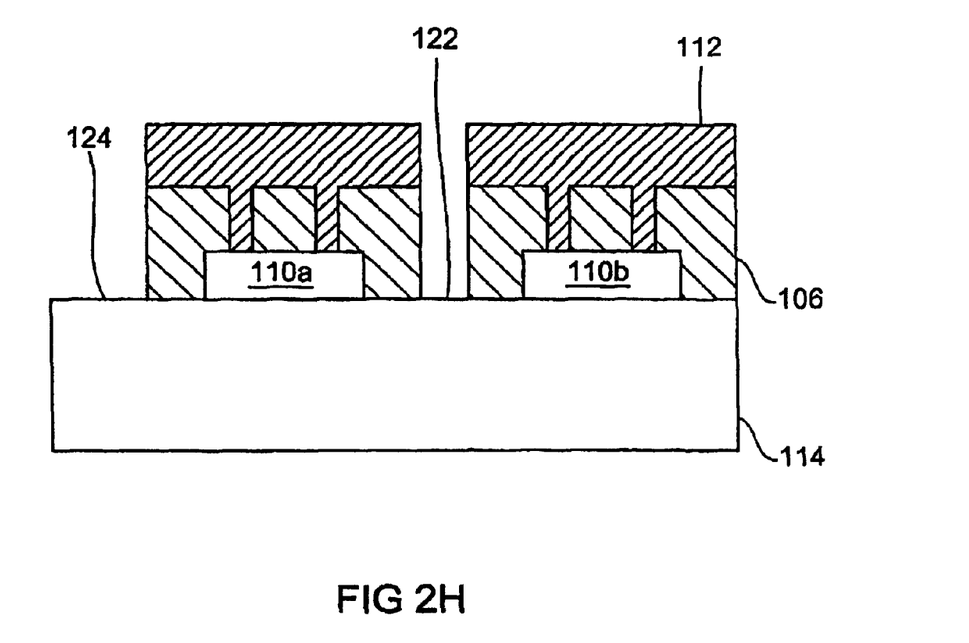

In order to close the openings 108a and 108b, in the illustrated embodiment, a further polymer layer 112 is deposited on the structure illustrated in FIG. 2F, as it is shown in FIG. 2G. In the illustrated embodiment, the further polymer layer 112 is made from the same material as the first polymer layer 106, however, in other embodiments, it can also be formed by a different material. As can be seen, a closing of openings 108a and 108b is achieved by depositing the further polymer layer 112. In a subsequent step, the further polymer layer 112 is patterned by using a third mask 126, wherein the third mask 126 defines the pad areas 124 and cutting lines 122 already described with reference to FIG. 2E. The exposed areas of the further polymer layer 112 are cross-linked, and the non-cross-linked areas are removed in a subsequent development step, so that the final pattern of the wafer illustrated in FIG. 2H results.

In a further, not illustrated method step, the wafer 114 can also be singulated to generate the single elements. These single elements are then contacted and disposed in respective packages.

With regard to the above-described patterning steps it should be noted that when patterning the first polymer layer 106, the used solvent should be chosen such that there will be no biting or dissolution of the material of the sacrificial layer. Also, when removing the sacrificial layer, it has to be ensured that the used solvent does not bite or dissolve the polymer material of the first polymer layer 106.

Figure 3A:
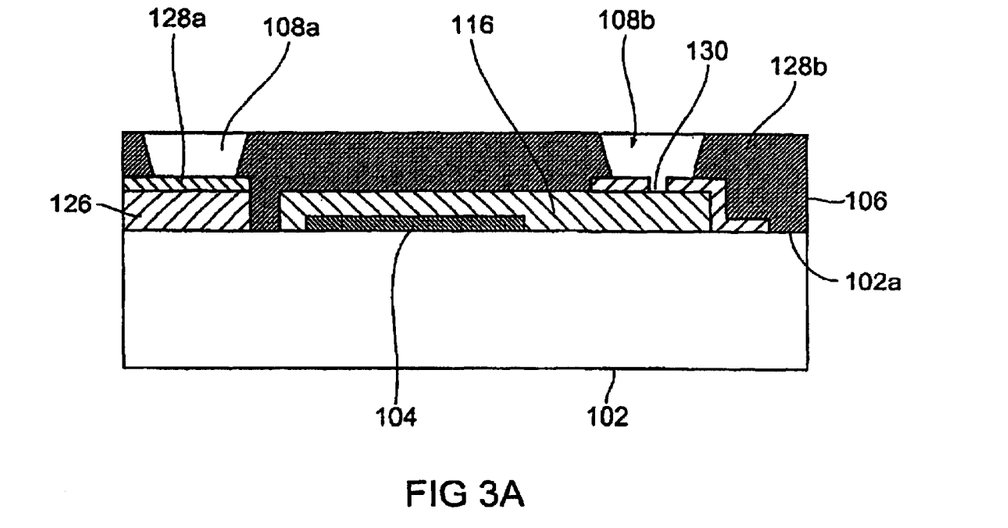
FIGS. 3A–3C are the production steps of the inventive method according to a second embodiment.

Subsequently, with reference to FIG. 3, a second embodiment of the inventive method will be described in more detail with regard to the production of a protective cover for a device on a substrate. A structure is shown in FIG. 3A, which results after opening the first polymer layer. In FIG. 3A, a substrate 102 is shown, where schematically an active area 104 of a device disposed therein is shown. Here, the sacrificial layer 116 is made, for example, of copper, and disposed on a first surface 102a of the substrate, and covers the active area 104 of the device contained in the substrate. Further, a pad metallization 126 is formed on the first surface 102a of the substrate 102, which is formed here preferably of the same material, namely copper (Cu), as the sacrificial layer/sacrificial pattern 116. This has the advantage that by depositing and patterning a copper layer, the sacrificial pattern 116 and the metallization 126 are formed simultaneously. A first UBM 128a (UBM=under bump metallization), for example of gold (Au), is formed on the pad metallization 126. Further, a second UBM 128b, for example of gold (Au) is formed on a portion of the sacrificial layer 116. The second UBM 128b extends, as shown in FIG. 3A, from a surface of the sacrificial layer 116 facing away from the substrate 102 to the first surface 102a of the substrate 102. To enable a subsequent removal of the sacrificial layer 116, the second UBM 128b has an opening, which exposes the sacrificial layer 116. As can further be seen, the first polymer layer 106 comprises openings 108a and 108b in the area of the UBMs 128a and 128b.

Figure 3B:
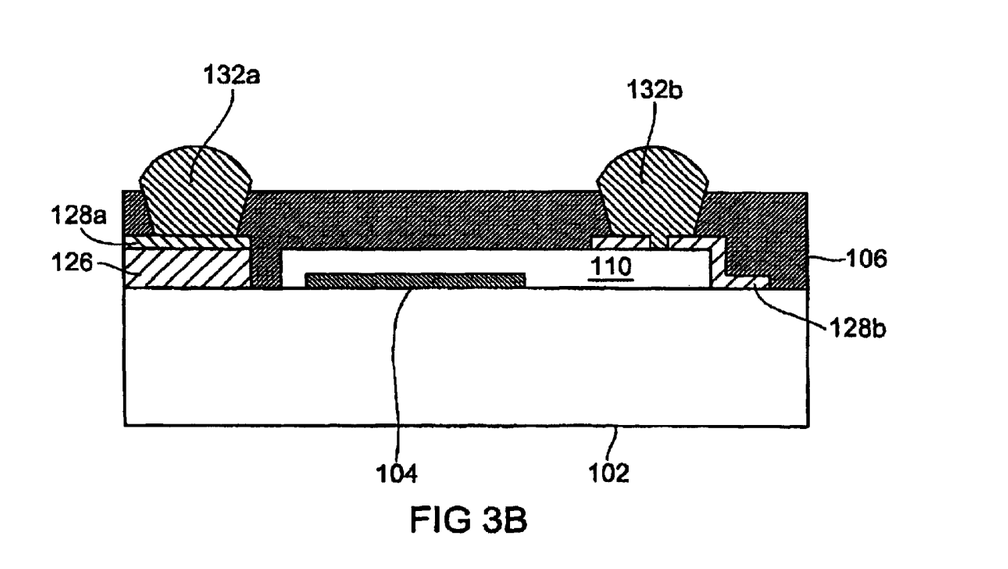

In a subsequent method step, the sacrificial layer 116 is removed by applying a solvent on the same, wherein due to the opening 130, merely the sacrificial layer 116 is removed, but not the metallization 126, which is protected by the first UBM 128a. In the embodiment shown in FIG. 3, the openings 108a and 108b will be closed by a solder paste 132a, 132b as it is shown in FIG. 3B, where also the resulting cavity 110 over the active area 104 of the device of the substrate 102 is shown.

Figure 3C:
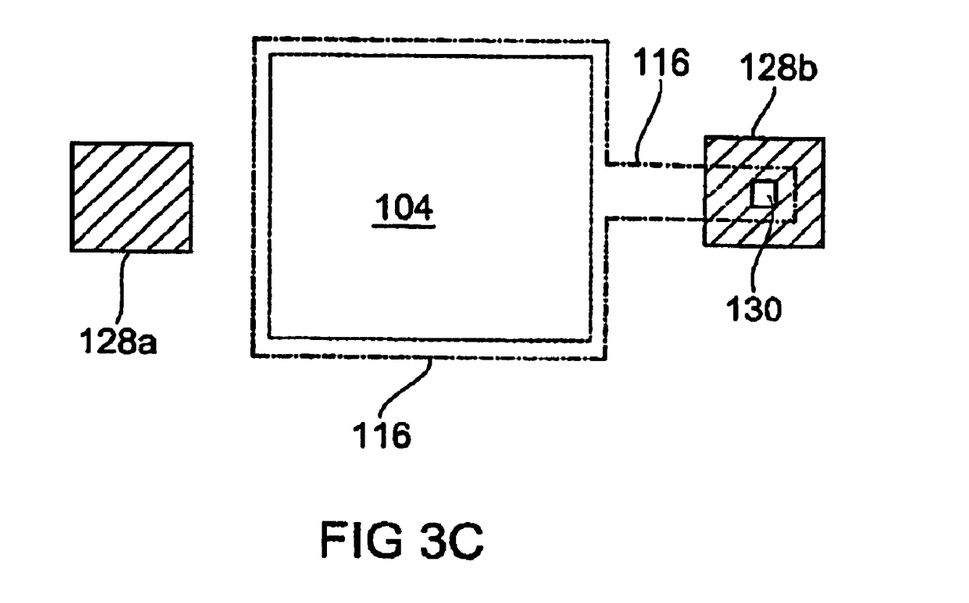

FIG. 3C shows a top view of the structure shown in FIG. 3B and illustrates again the areas exposed by the sacrificial layer 116. Specifically, the area shown in dashed lines in FIG. 3C is the one exposed by the sacrificial layer 116.

A respective contacting of the device in the substrate to the outside results over the pads 128a and 128b. The solder paste can, for example, be deposited by the known reflow method, after the sacrificial layer has been etched free.

Although preferred embodiments of the present invention have been explained above, the present invention is of course not limited thereto.

Instead of the described polymer materials, other suitable materials, such as deposited layers of silicon nitride, silicon oxide, metals, metal compounds can be used.

The thickness of the deposited polymer material layers is preferably between 1 $\mu$m and 100 $\mu$m. Further preferably the thickness of the deposited polymer material layers is between 1 $\mu$m and 20 $\mu$m.

While this invention has been described in terms of several preferred embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. Method for generating a protective cover for a device, wherein a wafer is provided, which comprises a plurality of devices, wherein each of the devices has a sensitive device area and a pad area, the method comprising:

(a) forming a sacrificial pattern on a surface of the wafer, wherein the sacrificial pattern covers at least areas of the wafer that include the sensitive device area of the devices;

(b) depositing a polymer layer, which covers the sacrificial pattern and proximal portions of the surface of the wafer;

(c) patterning the polymer layer to expose a portion of the sacrificial pattern through an opening in the polymer layer and the pad area;

(d) removing the sacrificial pattern;

(e) closing the opening formed in the polymer layer; and (f) singulating the wafer.

2. Method according to claim 1, wherein step (c) further includes pattering the polymer layer such that a cutting line is exposed by the patterning.

3. Method according to claim 1, wherein step (e) comprises:

(e.1.) depositing a further polymer layer on the structure resulting after step (d), to close the opening in the first polymer layer by the material of the second polymer layer; and (e.2.) patterning the further polymer layer to expose the pad area again.

4. Method according to claim 3, wherein the polymer layer and the further polymer layer include the same material.

5. Method according to claim 1, wherein step (c) comprises:

(c.1.) exposing the polymer layer by using a mask to generate cross-linked areas and non-cross-linked areas of the polymer layer, wherein the mask defines the opening and the pad area; and (c.2.) removing the non-cross-linked areas of the polymer layer.

6. Method according to claim 1, wherein the step (e) comprises laminating and photolithographic patterning of a foil on the structure resulting after step (d) to close the opening.

7. Method according to claim 1, wherein step (e) comprises closing the opening using a metal paste.

8. Method according to claim 1, wherein the sacrificial pattern is made from a material selected from the group consisting of a photoresist, a metal and an oxide.

9. Method according to claim 1, wherein the polymer layer includes SU-8.

10. Method according to claim 1, wherein each of the devices is selected from the group consisting of a BAW filter, a resonator, a sensor and an actuator.

11. Method according to claim 1, wherein the structure resulting from step (d) is dried prior to step (e).

12. A method for generating a protective cover for at least one device disposed on a wafer, a first device of the at least one devices having a sensitive device area and a pad area, the method comprising:

(a) forming a sacrificial pattern on a surface of the wafer, wherein the sacrificial pattern covers at least the sensitive device area of the first device;

(b) forming a polymer layer on the sacrificial pattern and at least proximal portions of the surface of the wafer;

(c) forming an opening in the polymer layer to expose a portion of the sacrificial pattern;

(d) removing the sacrificial pattern using the opening;

(e) closing the opening formed in the polymer layer.

13. The method according to claim 12, wherein step (c) further includes forming a second opening in the polymer layer to expose a contact area.

14. The method according to claim 12, wherein step (e) comprises depositing a further polymer layer on the structure resulting after step.

15. The method according to claim 12, wherein step (c) comprises forming the opening in the polymer layer using a mask.

16. The method according to claim 12, wherein the step (e) comprises laminating and photolithographic patterning of a foil on the structure resulting after step (d) to close the opening.

17. The method according to claim 12, wherein step (e) comprises closing the opening using a metal paste.

18. The method according to claim 12, wherein the sacrificial pattern includes a material selected from the group consisting of a photoresist, a metal and an oxide.

19. Method according to claim 12, wherein the first device is selected from the group consisting of a BAW filter, a resonator, a sensor and an actuator.

20. Method according to claim 12, further comprising the step of performing an active drying process on the polymer layer prior to step (e).

* * * * *